United States Patent
Ju

(10) Patent No.: US 11,386,824 B2
(45) Date of Patent: Jul. 12, 2022

(54) DISPLAY DEVICE AND POWER MANAGEMENT CHIP FOR THE SAME

(71) Applicant: WUHAN CHINA STAR OPTOELECTRONICS SEMICONDUCTOR DISPLAY TECHNOLOGY CO., LTD., Hubei (CN)

(72) Inventor: Rui Ju, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 358 days.

(21) Appl. No.: 16/623,917

(22) PCT Filed: Oct. 16, 2019

(86) PCT No.: PCT/CN2019/111492
§ 371 (c)(1),
(2) Date: Dec. 18, 2019

(87) PCT Pub. No.: WO2021/007968
PCT Pub. Date: Jan. 21, 2021

(65) Prior Publication Data
US 2021/0407355 A1 Dec. 30, 2021

(30) Foreign Application Priority Data
Jul. 18, 2019 (CN) .......................... 201910649776.9

(51) Int. Cl.
*G09G 5/00* (2006.01)
*G09G 3/20* (2006.01)
(Continued)

(52) U.S. Cl.
CPC ............... *G09G 3/20* (2013.01); *H03K 3/012* (2013.01); *H03K 3/3565* (2013.01); *G09G 2330/021* (2013.01); *H03K 2005/00267* (2013.01)

(58) Field of Classification Search
CPC .... G09G 3/20; G09G 2330/021; H03K 3/012; H03K 3/3565; H03K 2005/00267
(Continued)

(56) References Cited

U.S. PATENT DOCUMENTS

2014/0375604 A1* 12/2014 Kobayashi ........... G09G 3/3648 345/87
2015/0054776 A1* 2/2015 Reitan .................. G06F 3/0441 345/174
(Continued)

FOREIGN PATENT DOCUMENTS

CN 104538003 A 4/2015
CN 105139823 A 12/2015
(Continued)

*Primary Examiner* — Jennifer T Nguyen

(57) ABSTRACT

A display device and a power management chip are provided. The power management chip includes a rising-edge trigger, detecting rising edges of a pulse signal; a first counter, configured to calculate the number of the rising edges; a falling-edge trigger, detecting falling edges of the pulse signal; a second counter, configured to calculate the number of the falling edges of the pulse signal; an adder, configured to sum up the number of the rising edges and the number of the falling edges of the pulse signal; and a digital-to-analog converter, electrically connected to the adder, configured to convert to a target voltage based on the sum obtained by the adder. In such a way, the poweron time of the power management chip is reduced.

13 Claims, 4 Drawing Sheets

(51) Int. Cl.
*H03K 3/012* (2006.01)
*H03K 3/3565* (2006.01)
*H03K 5/00* (2006.01)

(58) Field of Classification Search
USPC ......................................................... 345/211
See application file for complete search history.

(56) References Cited

U.S. PATENT DOCUMENTS

2018/0158397 A1    6/2018  Nam et al.
2021/0068229 A1*   3/2021  Yu ........................ H05B 45/345

FOREIGN PATENT DOCUMENTS

CN    106528478 A    3/2017
CN    106710558 A    5/2017
CN    108550350 A    9/2018

* cited by examiner

| Bit/Rising edges | Voltage | DAC value | Bit/Rising edges | Voltage | DAC value |
|---|---|---|---|---|---|
| 0 / no pulse | -4.0 V | 000000 | 21 | -3.4 V | 010101 |
| 1 | -5.4 V | 000001 | 22 | -3.3 V | 010110 |
| 2 | -5.3 V | 000010 | 23 | -3.2 V | 010111 |
| 3 | -5.2 V | 000011 | 24 | -3.1 V | 011000 |
| 4 | -5.1 V | 000100 | 25 | -3.0 V | 011001 |
| 5 | -5.0 V | 000101 | 26 | -2.9 V | 011010 |
| 6 | -4.9 V | 000110 | 27 | -2.8 V | 011011 |
| 7 | -4.8 V | 000111 | 28 | -2.7 V | 011100 |
| 8 | -4.7 V | 001000 | 29 | -2.6 V | 011101 |
| 9 | -4.6 V | 001001 | 30 | -2.5 V | 011110 |
| 10 | -4.5 V | 001010 | 31 | -2.4 V | 011111 |
| 11 | -4.4 V | 001011 | 32 | -2.3 V | 100000 |
| 12 | -4.3 V | 001100 | 33 | -2.2 V | 100001 |
| 13 | -4.2 V | 001101 | 34 | -2.1 V | 100010 |
| 14 | -4.1 V | 001110 | 35 | -2.0 V | 100011 |
| 15 | -4.0 V | 001111 | 36 | -1.9 V | 100100 |
| 16 | -3.9 V | 010000 | 37 | -1.8 V | 100101 |
| 17 | -3.8 V | 010001 | 38 | -1.7 V | 100110 |
| 18 | -3.7 V | 010010 | 39 | -1.6 V | 100111 |
| 19 | -3.6 V | 010011 | 40 | -1.5 V | 101000 |
| 20 | -3.5 V | 010100 | 41 | -1.4 V | 101001 |

FIG. 4

DISPLAY DEVICE AND POWER MANAGEMENT CHIP FOR THE SAME

FIELD OF THE DISCLOSURE

The present application relates to display technologies, and more particularly to a display device and a power management chip for the same.

DESCRIPTION OF RELATED ARTS

With development of display technologies, display devices such as active matrix organic light-emitting diode (AMOLED) display devices have become more and more mature, and more and more applications have been applied in the field of displays.

For the AMOLED display devices, demands are highly increasing on OLED driving ability as display panel size is larger and larger and pixel density (e.g., pixels per inch, PPI) increases. An analog power voltage (AVDD), a driving voltage (ELVDD) and a low-level power voltage (ELVSS) that are integrated in a driver IC cannot satisfy the existing needs. It often needs a power management IC (PMIC) with a more powerful driving ability to provide the AVDD, ELVDD and ELVSS by the additional power management IC, in which the AVDD is used for the driver IC to generate a gamma voltage and a switching voltage of a thin-film transistor (TFT), and the ELVDD and ELVSS are driving voltages for OLED luminescence.

FIG. 1 is a schematic diagram showing an existing power management chip 10. An existing driving chip communicates with the power management chip 10 via a single wire (S-wire) interface. The existing power management chip 10 includes a rising-edge trigger 12, a counter 14 and a digital-to-analog converter (DAC) 16. The rising-edge trigger 12 receives pulses outputted by the driving chip and detects rising edges of the pulses. The counter 14 is electrically connected to the rising-edge trigger 12 for calculating the number of the rising edges of the pulses. The DAC 16 is electrically connected to the counter 14 for converting the number obtained by the counter 14 to a target voltage and outputting the same. In the existing arts, the driving chip outputs a different number of pulses to the power management chip 10, the power management chip 10 identifies input signals using the rising-edge trigger 12, the counter 14 calculates the number of cycles of the outputted pulses, and finally the DAC 16 converts it to a corresponding voltage and outputs the same.

FIG. 2 is a timing diagram of AVDD, ELVDD and ELVSS voltages generated by the power management chip 10 controlled by the driving chip in the existing arts. The three voltages AVDD, ELVDD and ELVSS are controlled separately and sequentially. In the existing arts, when the power management chip 10 detects the outputted pulses by the driving chip through the S-wire interface, only the rising edges of the pulses are detected. This delays the time able to supply power by the power management chip 10, thereby making poweron time of the display device become longer. At client ends, it needs to notice that the time of imputing a signal cannot be earlier than the time when the power is ready. Otherwise, exception is generated. Moreover, since the poweron time of the display device become longer, the starting-up time and the time needed to wake up from hibernation also become longer in machine applications, thereby affecting a user experience.

Technical Problems

The objective of the present application is to provide a display device and a power management chip for the same, for reducing the poweron time of the power management chip.

Technical Solutions

To achieve above object, in an aspect, the present application provides a power management chip for a display device, the power management chip configured to provide supply voltage required for driving the display device, the power management chip including:

a rising-edge trigger, receiving a pulse signal and detecting rising edges of the pulse signal;

a first counter, electrically connected to the rising-edge trigger, configured to calculate a number of the rising edges of the pulse signal;

a falling-edge trigger, receiving the pulse signal and detecting falling edges of the pulse signal;

a second counter, electrically connected to the falling-edge trigger, configured to calculate a number of the falling edges of the pulse signal;

an adder, electrically connected to the first counter and the second counter, configured to sum up the number of the rising edges of the pulse signal calculated by the first counter and the number of the falling edges of the pulse signal calculated by the second counter; and a digital-to-analog converter, electrically connected to the adder, configured to convert to a target voltage based on the sum obtained by the adder, wherein the pulse signal detected by the rising-edge trigger is identical to the pulse signal detected by the falling-edge trigger, and the target voltage is an analog voltage value.

In an embodiment of the present application, the rising-edge trigger and the falling-edge trigger receive the pulse signal via a single wire (S-wire) interface.

In an embodiment of the present application, the rising-edge trigger includes a D flip-flop and the falling-edge trigger includes any of a RS mater-slave flip-flop and a JK flip-flop.

In another aspect, the present application provides a power management chip for a display device, the power management chip configured to provide supply voltage required for driving the display device, the power management chip including:

a rising-edge trigger, receiving a pulse signal and detecting rising edges of the pulse signal;

a first counter, electrically connected to the rising-edge trigger, configured to calculate a number of the rising edges of the pulse signal;

a falling-edge trigger, receiving the pulse signal and detecting falling edges of the pulse signal;

a second counter, electrically connected to the falling-edge trigger, configured to calculate a number of the falling edges of the pulse signal;

an adder, electrically connected to the first counter and the second counter, configured to sum up the number of the rising edges of the pulse signal calculated by the first counter and the number of the falling edges of the pulse signal calculated by the second counter; and a digital-to-analog converter, electrically connected to the adder, configured to convert to a target voltage based on the sum obtained by the adder.

In an embodiment of the present application, the rising-edge trigger and the falling-edge trigger receive the pulse signal via a single wire (S-wire) interface.

In an embodiment of the present application, the pulse signal detected by the rising-edge trigger is identical to the pulse signal detected by the falling-edge trigger.

In an embodiment of the present application, the target voltage is an analog voltage value.

In an embodiment of the present application, the rising-edge trigger includes a D flip-flop and the falling-edge trigger includes any of a RS mater-slave flip-flop and a JK flip-flop.

In still another aspect, the present application provides a display device, including a power management chip, a driving chip and a display panel, the power management chip generating a target voltage based on a pulse signal outputted by the driving chip for providing supply voltage required for driving the display panel, the power management chip including:

a rising-edge trigger, receiving the pulse signal from the driving chip and detecting rising edges of the pulse signal;

a first counter, electrically connected to the rising-edge trigger, configured to calculate a number of the rising edges of the pulse signal;

a falling-edge trigger, receiving the pulse signal from the driving chip and detecting falling edges of the pulse signal;

a second counter, electrically connected to the falling-edge trigger, configured to calculate a number of the falling edges of the pulse signal;

an adder, electrically connected to the first counter and the second counter, configured to sum up the number of the rising edges of the pulse signal calculated by the first counter and the number of the falling edges of the pulse signal calculated by the second counter; and a digital-to-analog converter, electrically connected to the adder, configured to convert to a target voltage based on the sum obtained by the adder for driving the display panel.

In an embodiment of the present application, the rising-edge trigger and the falling-edge trigger receive the pulse signal, which is outputted by the driving chip, via a single wire (S-wire) interface.

In an embodiment of the present application, the pulse signal detected by the rising-edge trigger and the pulse signal detected by the falling-edge trigger are a same pulse signal from the driving chip.

In an embodiment of the present application, the target voltage is an analog voltage value for providing the supply voltage required for driving the display panel.

In an embodiment of the present application, the rising-edge trigger includes a D flip-flop and the falling-edge trigger includes any of a RS mater-slave flip-flop and a JK flip-flop.

BENEFICIAL EFFECTS

In the display device and the power management chip for the same in accordance with the present application, the power management chip utilizes the rising-edge trigger and the failing-edge trigger to simultaneously detect the number of the rising edges and the falling edges of the pulses outputted by the driving chip, utilizes the adder to sum up the number of the rising edges and the number of the falling edges, and then the DAC converts it to the target voltage that is needed. By this way, the poweron time of the power management chip can be reduced, the possibility of an exception of poweron timing and signal timing is avoided, the time needed to wake up from hibernation is reduced, and end consumer satisfaction is improved.

DESCRIPTION OF DRAWINGS

FIG. 4 is a contrast table of the number of rising edges of pulses, ELVSS voltage values and DAC values in an example.

DESCRIPTION OF EMBODIMENTS OF THE DISCLOSURE

To make the objectives, technical schemes, and effects of the present application more clear and specific, the present application is described in further detail below with reference to the embodiments in accompanying with the appending drawings. It should be understood that the specific embodiments described herein are merely for explaining the present application, the term "embodiment" used in the context means an example, instance or illustration, and the present application is not limited thereto.

The present application provides a display device and a power management chip for the display device. In the present application, in addition to a rising-edge trigger, the power management IC (PMIC) or the power management chip is further provided with a falling-edge trigger. The rising-edge trigger and the falling-edge trigger detect rising edges and falling edges of pulses outputted by a driving chip, respectively. The power management chip calculates the number of the rising edges and the number of the falling edges, adds them up, and transmits the result to a digital-to-analog converter (DAC) to convert it to a target voltage that is needed.

Figure 1:
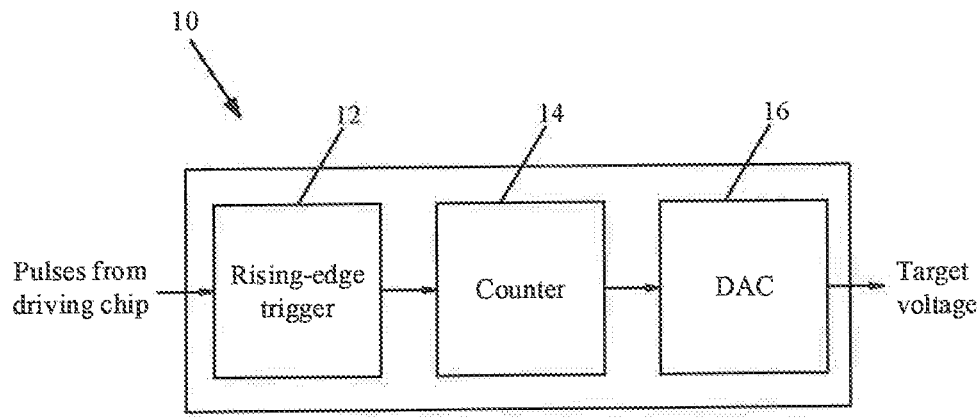
FIG. 1 is a schematic diagram showing an existing power management chip.
Figure 2:
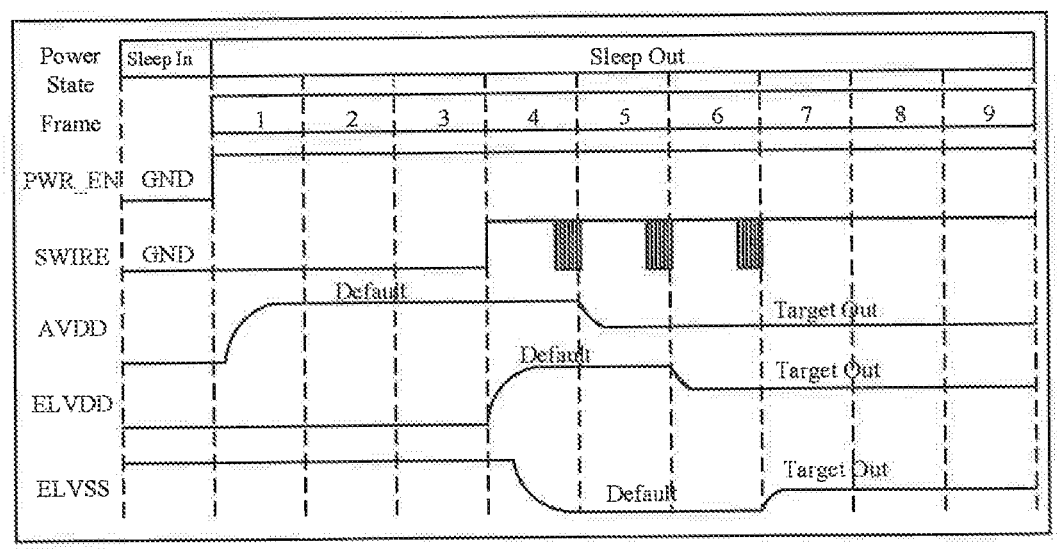
FIG. 2 is a timing diagram of AVDD, ELVDD and ELVSS voltages generated by a power management chip controlled by a driving chip in the existing arts.
Figure 3:
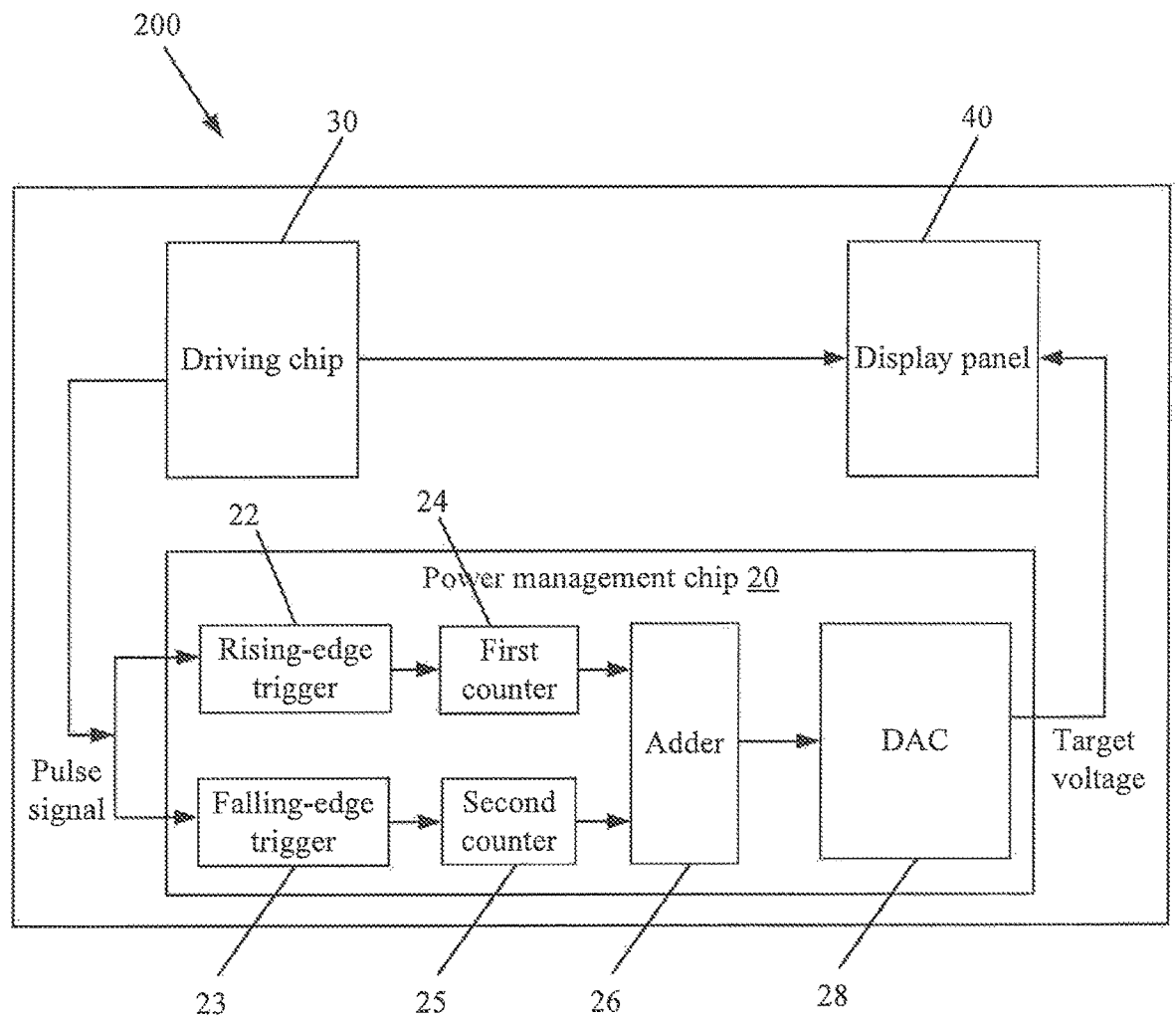
FIG. 3 is a schematic diagram illustrating a display device according to the present application.

FIG. 3 is a schematic diagram illustrating a display device 200 according to the present application. The display device 200 of the present application includes a power management chip 20, a driving chip 30 and a display panel 40. The driving chip 30 communicates with the power management chip 20 via a single wire (S-wire) interface, for example. The power management chip 20 generates a target voltage based on pulses outputted by the driving chip 30 so as to provide the voltages needed in driving the display panel 40. The driving chip 30 is used to provide a driving signal to the display panel 40 for driving pixels on the display panel 40 to produce gray level brightness to display an image.

For example, the display panel 40 is an organic light emitting diode (OLED) display panel. The power management chip 20 provides an analog power voltage (AVDD), a driving voltage (ELVDD) and a low-level power voltage (ELVSS) to the display panel 40, in which the AVDD is used for the driving chip to generate a gamma voltage and a switching voltage of a thin-film transistor (TFT), and the ELVDD and ELVSS are driving voltages for OLED luminescence.

The display device 200 of the present application is preferable to be an active-matrix display device such as an active-matrix liquid crystal display (AMLCD) device and an active-matrix organic light emitting diode (AMOLED) display device.

The driving chip 30 may include a gate driving circuit and a source driving circuit. The gate driving circuit provides scan signals to scan lines on the display panel 40 to switch on thin-film transistors of pixels one by one. The source driving circuit provides data signals to data lines on the display panel 40 to input the data signals to the pixels one by one. In this way, light emits from the pixels in different levels. The driving circuit 30 may only include any of the source driving circuit and the gate driving circuit, and the present application is not limited to any implementation.

As shown in FIG. 3, the power management chip 20 includes a rising-edge trigger 22, a falling-edge trigger 23, a first counter 24, a second counter 25, an adder 26 and a DAC 28. Through an interface (e.g., a S-wire interface), the input end of the power management chip 20 receives a pulse signal from the driving chip 30. The output end of the power management chip 20 outputs a target voltage, i.e., the voltage needed in driving the display panel 40, such as AVDD, ELVDD, ELVSS, and so on.

The rising-edge trigger 22 receives the pulse signal from the driving chip 30 and detects rising edges of the pulse signal. The first counter 24 is electrically connected to the rising-edge trigger 22 for calculating the number of the rising edges of the pulse signal. Specifically, through the S-wire interface, the rising-edge trigger 22 receives the pulse signal outputted by the driving chip 30. The falling-edge trigger 23 receives the pulse signal from the driving chip 30 and detects falling edges of the pulse signal. The second counter 25 is electrically connected to the falling-edge trigger 23 and is configured to calculate the number of the falling edges of the pulse signal. Specifically, through the S-wire interface, the falling-edge trigger 23 receives the pulse signal outputted by the driving chip 30. The pulse signal detected by the rising-edge trigger 22 and the pulse signal detected by the falling-edge trigger 23 are a same pulse signal from the driving chip 30.

The adder 26 is electrically connected to the first counter 24 and the second counter 25 and is configured to sum up the number of the rising edges of the pulse signal calculated by the first counter 24 and the number of the falling edges of the pulse signal calculated by the second counter 25.

The DAC 28 is electrically connected to the adder 26 and is configured to convert to a target voltage based on the sum obtained by the adder 26 for driving the display panel 40. Specifically, the target voltage is an analog voltage value for providing the voltage needed in driving the display panel 40.

The rising-edge trigger 22 can be implemented by a D flip-flop. The rising-edge trigger 22 outputs a high-level voltage (or a low-level voltage) at an instant moment of the rising edge of an inputted pulse. The falling-edge trigger 23 can be implemented by a RS mater-slave flip-flop or a JK flip-flop. The falling-edge trigger 23 outputs a high-level voltage (or a low-level voltage) at an instant moment of the falling edge of an inputted pulse. The function of the first counter 24 is to calculate the number of the rising edges of the pulse signal based on the high-level voltage (or the low-level voltage) outputted by the rising-edge trigger 22; the function of the second counter 25 is to calculate the number of the falling edges of the pulse signal based on the high-level voltage (or the low-level voltage) outputted by the falling-edge trigger 23. The adder 26 calculates a sum of the rising edges and the falling edges of the pulse signal.

Finally, the number is converted to a corresponding analog voltage value by the DAC 28.

FIG. 4 is a contrast table of the number of rising edges of pulses, ELVSS voltage values and DAC values in an example. In FIG. 4, the number of the rising edges of the pulses corresponds to ELVSS voltage value. It indicates that a to-be-outputted ELVSS target voltage depends on the detected number of the rising edges of the pulses. Also, based on a corresponding DAC value, the detected number of the rising edges of the pulses is converted to analog voltage value (i.e., the target voltage). For example, if the target voltage is −5.3V, the number of the rising edges of the pulses needed to be outputted by the driving chip is 2 (or the rising-edge trigger needs to detect two rising edges).

Figure 5:
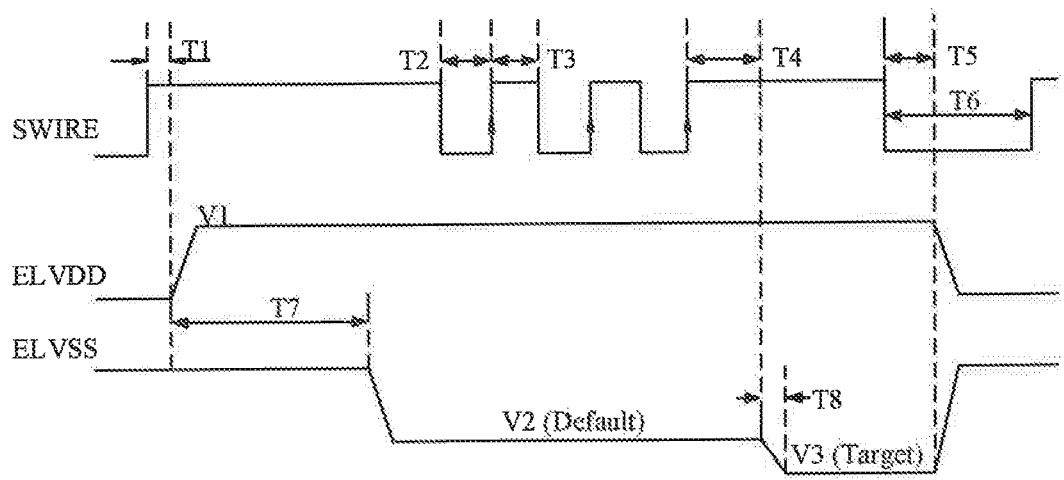
FIG. 5 is a diagram illustrating timing in controlling a power management chip by a driving chip in the existing arts.
Figure 6:
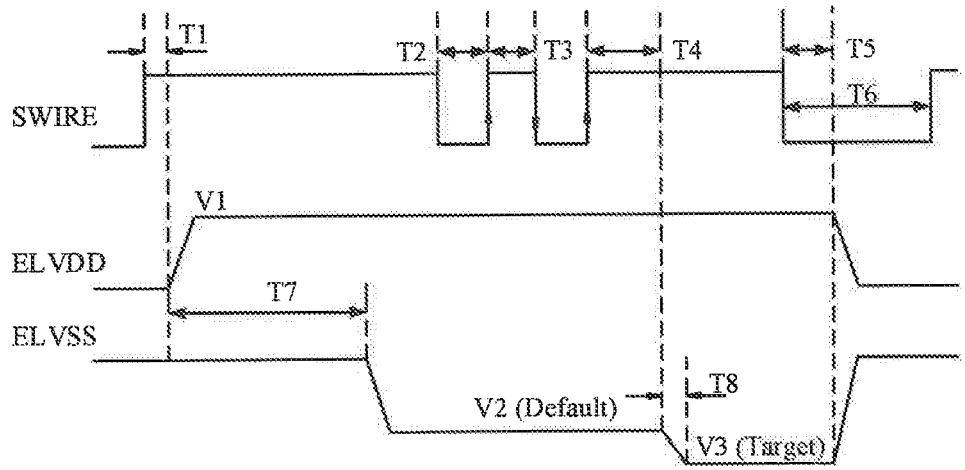
FIG. 6 is a diagram illustrating timing in controlling a power management chip by a driving chip in the present application.

FIG. 5 is a diagram illustrating timing in controlling a power management chip by a driving chip in the existing arts. FIG. 6 is a diagram illustrating timing in controlling a power management chip by a driving chip in the present application. For clarity, FIGS. 5 and 6 are described together in order to highlight the differences between the present application and the existing arts. Also, the following is illustrated by ELVSS voltage.

As shown in FIG. 5, in the existing arts, the power management chip only detects the number of the rising edges of the pulse signal outputted by the driving chip. Assuming that the target voltage is −5.3V and the number of the rising edges is two, the existing arts need one pulse cycle to be able to detect one rising edge and two rising edges correspond to two pulse cycles, that is, about T=2*(T2+T3). This delays the time to output the ELVSS voltage by the power management chip. That is, the poweron time of the power management chip becomes longer.

As shown in FIG. 6, in the present application, the power management chip simultaneously detects the number of the rising edges and the number of the failing edges of the pulse signal outputted by the driving chip (through the rising-edge trigger and the falling-edge trigger, respectively). Assuming that the target voltage is −5.3V and the number of the rising edges is two, the present application can detect one rising edge and one falling edge in one pulse cycle, and the detection using two rising edges can be replaced with the use of one rising edge and one falling edge, that is, about T=(T2+T3). In this way, the time to output the ELVSS voltage by the power management chip in the present application is earlier than that in the existing arts. The poweron time of the power management chip can be reduced to a half. It is more apparent for reduced time in case of a large amount of pulses.

In the display device and the power management chip for the same in accordance with the present application, the power management chip utilizes the rising-edge trigger and the falling-edge trigger to simultaneously detect the number of the rising edges and the falling edges of the pulses outputted by the driving chip, utilizes the adder to sum up the number of the rising edges and the number of the falling edges, and then the DAC converts it to the target voltage that is needed. By this way, the poweron time of the power management chip can be reduced, the possibility of an exception of poweron timing and signal timing is avoided, the time needed to wake up from hibernation is reduced, and end consumer satisfaction is improved.

While the preferred embodiments of the present application have been illustrated and described in detail, various modifications and alterations can be made by persons skilled in this art. The embodiment of the present application is therefore described in an illustrative but not restrictive sense. It is intended that the present application should not be limited to the particular forms as illustrated, and that all modifications and alterations which maintain the realm of the present application are within the scope as defined in the appended claims.

The invention claimed is:

1. A power management chip for a display device, the power management chip configured to provide supply voltage required for driving the display device, the power management chip comprising:
   a rising-edge trigger, receiving a pulse signal and detecting rising edges of the pulse signal;
   a first counter, electrically connected to the rising-edge trigger, configured to calculate a number of the rising edges of the pulse signal;
   a falling-edge trigger, receiving the pulse signal and detecting falling edges of the pulse signal;
   a second counter, electrically connected to the falling-edge trigger, configured to calculate a number of the falling edges of the pulse signal;
   an adder, electrically connected to the first counter and the second counter, configured to sum up the number of the rising edges of the pulse signal calculated by the first counter and the number of the falling edges of the pulse signal calculated by the second counter; and
   a digital-to-analog converter, electrically connected to the adder, configured to convert to a target voltage based on the sum obtained by the adder,
   wherein the pulse signal detected by the rising-edge trigger is identical to the pulse signal detected by the falling-edge trigger, and the target voltage is an analog voltage value.

2. The power management chip according to claim 1, wherein the rising-edge trigger and the falling-edge trigger receive the pulse signal via a single wire (S-wire) interface.

3. The power management chip according to claim 1, wherein the rising-edge trigger comprises a D flip-flop and the falling-edge trigger comprises any of a RS mater-slave flip-flop and a JK flip-flop.

4. A power management chip for a display device, the power management chip configured to provide supply voltage required for driving the display device, the power management chip comprising:
   a rising-edge trigger, receiving a pulse signal and detecting rising edges of the pulse signal;
   a first counter, electrically connected to the rising-edge trigger, configured to calculate a number of the rising edges of the pulse signal;
   a falling-edge trigger, receiving the pulse signal and detecting falling edges of the pulse signal;
   a second counter, electrically connected to the falling-edge trigger, configured to calculate a number of the falling edges of the pulse signal;
   an adder, electrically connected to the first counter and the second counter, configured to sum up the number of the rising edges of the pulse signal calculated by the first counter and the number of the falling edges of the pulse signal calculated by the second counter; and
   a digital-to-analog converter, electrically connected to the adder, configured to convert to a target voltage based on the sum obtained by the adder.

5. The power management chip according to claim 4, wherein the rising-edge trigger and the falling-edge trigger receive the pulse signal via a single wire (S-wire) interface.

6. The power management chip according to claim 4, wherein the pulse signal detected by the rising-edge trigger is identical to the pulse signal detected by the falling-edge trigger.

7. The power management chip according to claim 4, wherein the target voltage is an analog voltage value.

8. The power management chip according to claim 4, wherein the rising-edge trigger comprises a D flip-flop and the falling-edge trigger comprises any of a RS mater-slave flip-flop and a JK flip-flop.

9. A display device, comprising a power management chip, a driving chip and a display panel, the power management chip generating a target voltage based on a pulse signal outputted by the driving chip for providing supply voltage required for driving the display panel, the power management chip comprising:
   a rising-edge trigger, receiving the pulse signal from the driving chip and detecting rising edges of the pulse signal;
   a first counter, electrically connected to the rising-edge trigger, configured to calculate a number of the rising edges of the pulse signal;
   a falling-edge trigger, receiving the pulse signal from the driving chip and detecting falling edges of the pulse signal;
   a second counter, electrically connected to the falling-edge trigger, configured to calculate a number of the falling edges of the pulse signal;
   an adder, electrically connected to the first counter and the second counter, configured to sum up the number of the rising edges of the pulse signal calculated by the first counter and the number of the falling edges of the pulse signal calculated by the second counter; and
   a digital-to-analog converter, electrically connected to the adder, configured to convert to a target voltage based on the sum obtained by the adder for driving the display panel.

10. The display device according to claim 9, wherein the rising-edge trigger and the falling-edge trigger receive the pulse signal, which is outputted by the driving chip, via a single wire (S-wire) interface.

11. The display device according to claim 9, wherein the pulse signal detected by the rising-edge trigger and the pulse signal detected by the falling-edge trigger are a same pulse signal from the driving chip.

12. The display device according to claim 9, wherein the target voltage is an analog voltage value for providing the supply voltage required for driving the display panel.

13. The display device according to claim 9, wherein the rising-edge trigger comprises a D flip-flop and the falling-edge trigger comprises any of a RS mater-slave flip-flop and a JK flip-flop.

* * * * *